United States Patent [19]
Stanton

[11] Patent Number: 5,891,605
[45] Date of Patent: Apr. 6, 1999

[54] REDUCTION IN DAMAGE TO OPTICAL ELEMENTS USED IN OPTICAL LITHOGRAPHY FOR DEVICE FABRICATION

[75] Inventor: Stuart Thomas Stanton, Bridgewater, N.J.

[73] Assignee: Lucent Technologies Inc., Murray Hill, N.J.

[21] Appl. No.: 586,412

[22] Filed: Jan. 16, 1996

[51] Int. Cl.[6] .................................................... G03C 5/00
[52] U.S. Cl. ...................... 430/296; 430/311; 250/492.1; 250/492.3
[58] Field of Search ................................... 430/311, 296; 250/492.1, 492.3

[56] References Cited

U.S. PATENT DOCUMENTS

| | | | |
|---|---|---|---|
| 3,447,856 | 6/1969 | De Lange | 359/264 |
| 5,003,543 | 3/1991 | Morsell et al. | 250/492.2 |
| 5,005,969 | 4/1991 | Katoaka | 353/122 |
| 5,089,711 | 2/1992 | Morsell et al. | 250/492.3 |
| 5,491,534 | 2/1996 | Shiozawa | 355/69 |

FOREIGN PATENT DOCUMENTS

WO94/20883A 9/1994 WIPO .......................... G03B 27/34

*Primary Examiner*—Maria Nuzzolillo
*Assistant Examiner*—Laura Werner
*Attorney, Agent, or Firm*—Patricia A. Verlangieri

[57] ABSTRACT

An optical lithographic process and system for fabricating devices which includes an optical subsystem for reducing the rate of damage to the system's optics caused by exposure to energy pulses from an exposure source. The optical subsystem transforms a primary energy pulse from the exposure source into N secondary pulses, where N is $\geq 2$ with a delay provided between each secondary pulse so as to reduce the peak intensity of the energy pulse being transmitted through the optical system. The subsystem redirects the secondary pulses spatially to satisfy source requirements for appropriate lithographic illuminators. Furthermore, the subsystem may be an intrinsic design feature of the illuminator or exposure source.

4 Claims, 3 Drawing Sheets

REDUCTION IN DAMAGE TO OPTICAL ELEMENTS USED IN OPTICAL LITHOGRAPHY FOR DEVICE FABRICATION

FIELD OF THE INVENTION

The invention relates to the fabrication of devices using optical lithography and, in particular, to reducing damage to optical elements caused by prolonged exposure to deep ultra-violet (DUV) radiation.

BACKGROUND OF THE INVENTION

In device fabrication, optical lithography, such as projection printing using steppers and scanners, is a technique for transferring a desired pattern from a mask onto the surface of a semiconductor wafer. Such technique employs an exposure source to image the pattern through an optical system. The pattern corresponds to circuit features that comprise various parts of an electronic device. The continuing demand for further miniaturization of devices has facilitated the use of exposure sources with shorter wavelengths in order to achieve smaller image resolution. For example, projection printers operating in the DUV region (248 nm or shorter) have been able to image linewidths of about 0.25 $\mu$m. However, DUV radiation, at least at the intensity levels which are desirable for commercial applications, tends to cause damage to the optical elements in the projection printers.

In conventional DUV projection printers, the optical system comprises mostly or all transmissive elements. One of the few materials for high precision optics which transmits DUV radiation is fused silica. Rothschild et al., Excimer Laser Projection Lithography: Optical Considerations, Microelectronic Engineering Vol. 9, pages 27–29 (1989), which is herein incorporated by reference for all purposes. As such, it has become the material of choice for use in the manufacturing of optical elements for DUV printers. To achieve the desired image resolution, i.e., image resolution similar to the wavelength of the exposure source, the optical system is diffraction limited. In diffraction limited systems, the specifications of the lenses are well below diffraction limited and balanced in the overall system for small net wavefront aberration. For example, the root mean square (RMS) wavefront error for a typical optical system is about $\frac{1}{10}^{th}$ of the wavelength of the exposure source. Even stricter requirements imposed on the individual optical elements make them very sensitive to phenomenon which would alter their behavior.

The predominant exposure sources used in DUV projection printers are excimer lasers, such as the KrF (248 nm) and ArF (193 nm). This is due to the fact that excimer lasers can generate adequate power output (about 2–20 W) necessary to satisfy manufacturing throughput demands. In addition, the power output of excimer lasers is relatively stable, which is important for dose control. For example, fluctuations in output amplitude of a typical excimer laser is about $\leq 3\%$.

The power output of the excimer lasers is generated by short pulses. "Short pulses" are pulses of a frequency F each having a pulse width ($\tau$) that is significantly less than the time gap between each pulse (1/F). As known in the art, the shape of excimer pulses varies with the type of excimer laser being used and therefore, may be difficult to clearly define the pulse width of an excimer pulse. For convenience, the pulse width, as used herein, begins where the energy of the pulse can be detected by, for example, attenuators or silicon photo-diodes and ends at about the point where 99% of the pulse energy has been detected. For current commercially available excimer lasers, the pulse width is about 10–30 nsec and F is about 200–500 Hz.

Each output pulse or shot from an excimer laser is typically about 10–50 mJ. Studies have shown that fused silica, when exposed to such intensity levels at 248 or shorter, is subjected to phenomenon known as laser-induced damage. See Rothschild et al., Excimer Laser Projection Lithography: Optical Considerations, Microelectronic Engineering, Vol. 9, pages 27–29 (1989), which is already incorporated by reference for all purposes. The major modes of laser-induced damage in fused silica are color center formation and optical compaction. The formation of E' color centers leads to increased optical absorption at the exposure source wavelength. Optical compaction alters the lens dimensionally and increases the index of refraction in the compacted area, thus causing wavefront aberrations such as 1) instantaneous changes in the wavefront properties of the lens as a pulse is transmitted, 2) accumulated changes in the wavefront or overall transmission efficiency of the lens, and 3) thermal degradation of the lens wavefront due to absorption of a larger fraction of power. As such, laser-induced damage adversely affects the characteristics of the optical system, thus degrading the performance of projection printers.

The initial mechanisms causing the damage have been identified as the multi-photon interactions in the material activated by extremely high momentary intensity levels. The rate of multi-photon absorption laser-induced damage often has a quadratic dependence to pulse intensity in the practical regime of intensities that might be used. Furthermore, laser-induced damage to the optics is even more severe as the wavelength of the exposure source becomes shorter because fused silica is much more absorptive at shorter wavelengths. For example, the rate of laser-induced damage at 193 nm for ArF laser is much greater than that at 248 nm for KrF laser. See Rothschild et al., Excimer Laser Projection Lithography: Optical Considerations, Microelectronic Engineering Vol. 9, pages 27–29 (1989).

In conventional scanners and steppers, projection lenses with reduction powers may have some elements near the wafer. These elements are exposed to the greatest intensity of energy from each pulse and therefore are most prone to laser induced damage. Moreover, the projection lens is one of the more critical and more expensive elements of the system. From the above description, it is therefore desirable to reduce the rate of damage to the optical system of projection printers and, in particular, to the projection lens of the optical system caused by exposure to DUV energy pulses, particularly as shorter wavelengths, photo resists requiring larger doses, or longer useful lens life becomes desirable.

SUMMARY OF INVENTION

The invention is directed to DUV lithography systems and processes for fabricating devices which reduce the rate of laser-induced damage to optical elements caused by exposure to DUV radiation. In accordance with one embodiment of the invention, the reduction in the rate of laser-induced damage is achieved by reducing the peak intensity of each pulse without affecting average power output of the exposure source. Each primary output pulse from a pulsed DUV source is separated into a plurality of secondary pulses, including at least N secondary pulses where N is greater than or equal to 2. In addition, the intensity of the secondary pulses is about $1/N^{th}$ the intensity of the primary output pulse. The N secondary pulses are delayed in time so that the majority of the pulse energy of each secondary pulse is separated from each other, resulting in a sequence of N pulses with lower peak intensity for each primary output pulse. These secondary pulses are then appropriately directed through the optical train of the lithography system for imaging a mask pattern on a semiconductor wafer. By reducing the peak intensity of each pulse by N, the rate of laser-induced damage to the optical elements is reduced by about N times. Furthermore, these secondary pulses are formed quite efficiently using simple and insensitive illumination optics that don't complicate or corrupt desirable characteristics of the laser or optics. Thus, the reduction in damage rate is achieved without substantially decreasing throughput, dose control, or imaging characteristics of the lithography system.

DETAILED DESCRIPTION OF THE INVENTION

The present invention relates to reducing laser-induced damage to optical elements caused by exposure to DUV energy pulses from an excimer laser. While illustrative embodiments of the invention are described with specific geometric configurations, it will be apparent to those skilled in the art that a variety of configurations which satisfy geometric requirements for proper lithographic illumination are also useful.

Figure 1:
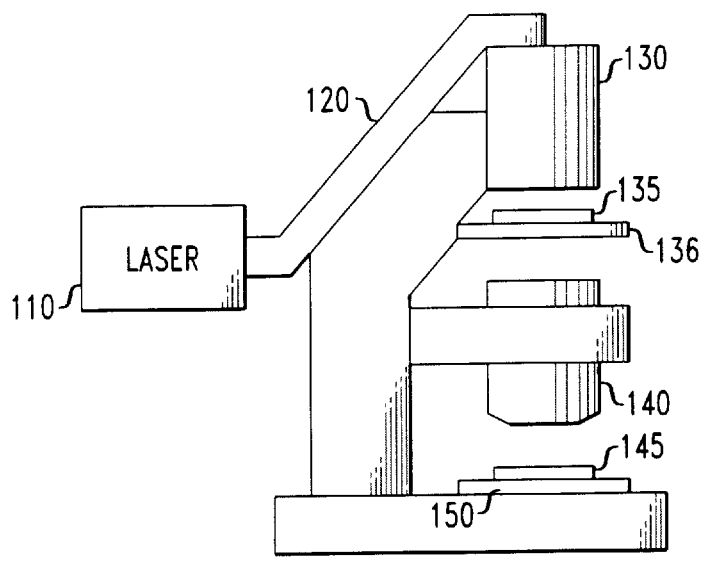
FIG. 1 is a simplified illustration of a conventional excimer projection printer used in the fabrication of devices.

FIG. 1 is a simplified illustration of a conventional excimer projection printer such as a scanner or stepper for fabricating device. Such systems, for example, are described in Pol et al., Excimer Laser-based lithography: a Deep Ultraviolet Wafer Stepper, SPIE vol. 633, 6 (1986) and Unger et al., Design and Performance of a Production-worthy Excimer Laser-Based Stepper, SPIE vol. 1674, (1992), both herein incorporated by reference for all purposes. The projection printer comprises an excimer exposure source 110, a beam delivery subsystem 120, an illuminator 130, a mask 135 mounted on a mask frame 136, a projection lens 140, and a stage 150.

In operation, excimer laser 110 sends pulses through the beam delivery subsystem. Typically, the beam delivery subsystem comprises various mirrors and/or reflective elements such as lenses to direct the pulses into the illuminator. Optionally, the beam delivery system includes attenuators, shutters, and devices for providing energy or wavelength measurements, as known in the art. The illuminator receives the pulses and spatially manipulates the energy from the pulses to provide optimum illumination of mask 135, which contains, for example, circuit patterns. Projection lens 140 then projects the image of the mask onto a wafer 145 mounted on stage 150. The stage includes precision translation and rotation control by a computer (not shown) for accurate pattern alignment.

As previously discussed, fused silica, the material from which the optical elements of the DUV projection printers are often made, is subjected to laser-induced damage when exposed to DUV radiation. The rate of laser-induced damage (D) in fused silica, at least in the early phases before self-annealing or saturation takes effect, has been found to have a linear dependence with the number of pulses and a quadratic dependence with the peak power-density within a laser pulse. See Hibbs et al., 193-nm Lithography at MIT Lincoln Lab, Solid State Technology, July 1995, and Yamagata, Degradation of Transmission of Silica glass on Excimer Laser Irradiation, Journal of the Ceramic Society of Japan, volume 100 (1992). One example of formalizing D is as follows:

$$D=a*E^2*J \tag{1}$$

where E is the energy density per pulse (mJ/cm$^2$) impinging on the optical element, J is the number of pulses, and a is scaling constant. Equation 1 can be rewritten as follows:

$$D=a*(E*J)*E \tag{2}$$

where the product E*J denotes the exposure dose being delivered to the wafer. Thus, a decrease in peak intensity by N requires a necessary increase in J by N in order to maintain the given dose. However, because E has a quadratic dependence to D and J has a linear dependence on D, reducing E will decrease D for a given dose.

The following equation, which is derived from equation 2, illustrates the decrease in damage rate when the peak intensity of the pulse is decreased by N for the given dose.

$$D=a*[(E/N)*(N*J)]*(E/N) \tag{3}$$

where the product (E/N) *(N*J) represents the given dose (E*J) obtained by reducing the peak intensity of each pulse and increasing the number of pulses by N. Equation 3 can be simplified as follows:

$$D=[a*(E*J)*E]/N \tag{4}$$

From equation 4, decreasing the peak of the dose intensity by N results in a decrease in damage rate by N. Of course, the actual decrease in damage rate varies due to losses that can occur in the transmission of the radiation.

In accordance with the invention, a divide and delay (DD) subsystem is employed to reduce the damage rate to the optical components of the projection printer by reducing the peak intensity (E) of the excimer pulses. Furthermore, this reduction, as will be apparent, is achieved at essentially the same average power output level as projection printers without the DD optical subsystem. Therefore, the DD subsystem reduces the damage rate without adversely affecting the throughput of the projection printers.

Figure 2:
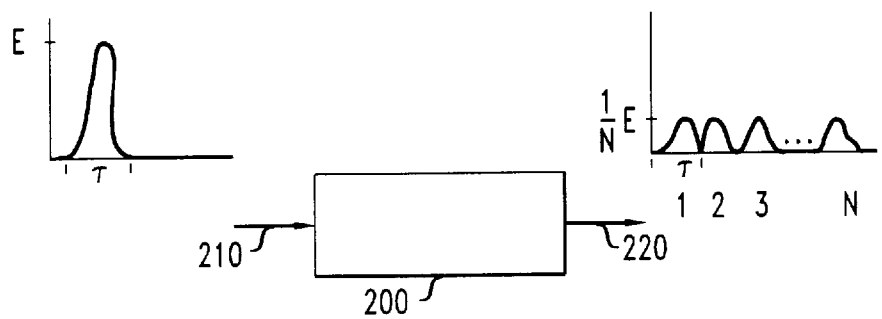
FIG. 2 is a block diagram of the Divide and delay (DD) optical subsystem.

Referring to FIG. 2, a functional block diagram of DD optical subsystem 200 is shown. As shown, the DD subsystem receives primary input pulses 210 from the excimer laser for processing. The DD subsystem then outputs the processed input pulses 220 to the illuminator. Although the DD subsystem is described as a discrete unit which is spatially located between the laser and illuminator, it will be apparent to those skilled in the art that the DD subsystem can be, for example, incorporated as part of the illuminator, beam delivery subsystem, or enclosed in the cabinet of the source laser.

Processing of the primary input pulses 210, which have peak intensity of E, frequency F, and pulse width τ, involves reducing the peak intensity of each primary pulse. By decreasing the peak intensity of the primary pulses, the rate of laser-induced damage to the optical elements downstream from the DD subsystem is decreased. Reduction in peak intensity is achieved by dividing each primary input pulse into N secondary pulses and incrementally delaying each N secondary pulse. As such, the secondary pulses, as they are output from the DD subsystem, are staggered.

In order to achieve essentially the same power output as projection printers without the DD subsystem, the N secondary pulses are confined within the time gap between the arrival of the next primary pulse. Of course, some energy may be lost due to transmission in the DD subsystem, but this loss may be negligible as highly efficient optical components or nearly lossless elements such as reflectors can be employed. Since the time gap between each primary pulse is very large compared to the pulse width, e.g., by a factor of $10^5$, the number of secondary pulses into which the primary pulse can be divided before the arrival of the next primary pulse is significant. In fact, this number is much greater than the number which is practical for implementing the DD subsystem. For example, the larger the number of secondary pulses, the more complex the DD subsystem becomes. In one embodiment, the number of secondary pulses formed is between 2 to 20. Preferably, the number of secondary pulses formed is between 2 to 15, more preferably, between 2 to 10, even more preferably, between 2 to 7, and most preferably, between 2 to 5. However, it should be appreciated that the upper limit on the number of secondary pulses is dependent on 1) the pulse width of the secondary pulses, 2) length of delay between each secondary pulse, and 3) the length of the time gap between successive primary pulses.

The amount that the peak intensity of each primary pulse is reduced depends on the number of times that the primary pulse is divided (i.e., the number of resulting secondary pulses) and the length of delay between each secondary pulse. For example, assuming that there is negligible or no loss in pulse energy from the elements in the DD subsystem and that each resulting secondary pulse has about the same peak intensity, dividing the primary pulse by N secondary pulses and delaying each successive secondary pulse by at least a pulse width would result in a reduction in peak intensity by about N times (1/N). Delays between successive secondary pulses of less than a pulse width reduces the peak intensity by less than N times. As such, the reduction in the rate of damage decreases as the delay between the successive secondary pulses and/or as the number of secondary pulses become smaller. In one embodiment, the delay between each secondary pulse is at least equal to about a pulse width. Alternatively, the delay between each secondary pulse is less than a pulse width, but long enough to provide a reduction in peak intensity such that the rate of laser-induced damage is reduced. It will be appreciated that the delays between each successive pulse need not be equal in order to achieve a reduction in the peak intensity of the primary pulses.

Various conventional techniques for delaying the secondary pulses can be employed. Such techniques, for example, provide separate beam paths for secondary pulses, each with different lengths to achieve the desired delay. Partial segmented reflectors, diffractive elements, or beam splitters may be used to provide separate beam paths. Given that the speed of light in air is roughly one foot per nanosecond, each successive secondary output pulse should travel an additional distance of at least about one foot for each nanosecond of delay. As such, to achieve a delay of a pulse width for a typical excimer pulse with pulse width of 20 nsec, the difference between each successive secondary pulse path is at least about 20 feet. It should be appreciated by those skilled in the art that various folding schemes using reflectors or mirrors can be used to provide secondary beam paths with different lengths to obtain the desired delay.

Figure 3:
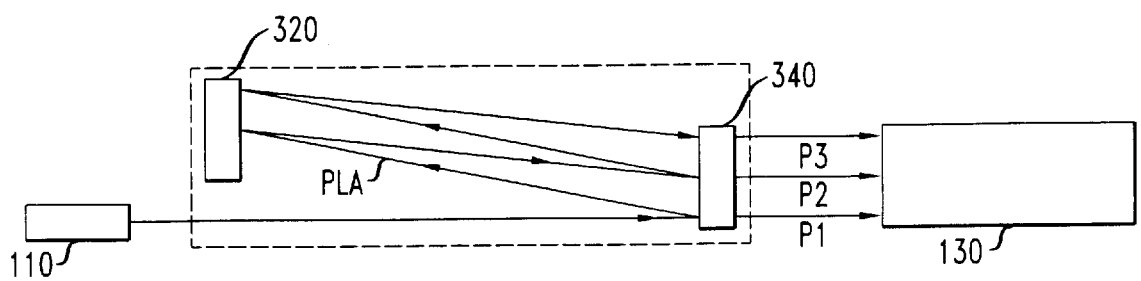
FIG. 3 is an illustrative embodiment of the DD optical subsystem.

FIG. 3 is an illustrative embodiment of the DD subsystem 200 for splitting a primary input pulse P into secondary pulses P 1, P2, and P3. The DD subsystem comprises an efficient reflector 320 and segmented partial (SP) reflector 340. Reflector 320 can be any conventional reflector used for reflecting DIW radiation. As pulse P enters the DD subsystem, it follows a path to the SP reflector which divides pulse P into P1 and P1a. The SP reflector passes P1 while reflecting P1a toward reflector 320. Reflector 320 then reflects P1a back toward SP reflector to divide P1a into P2 and P3. P2 passes through to the illuminator as P3 is reflected toward reflector 320. P3 is then reflected back at the SP reflector which transmits P3 to the illuminator.

Reflector 220 and SP reflector 340 are each spatially separated by a distance d. Illustratively, the geometry of the DD subsystem provides a delay for each successive beam path which is equal to about the time it takes for light to travel a distance of 2*d. For example, d is at least 10 feet to provide a delay of at least 20 nsec, which is the pulse width for a typical excimer pulse. Optionally, as well-known in the art, folding mirrors can advantageously be located within the beam paths to compress the size of the DD subsystem.

Figure 4:
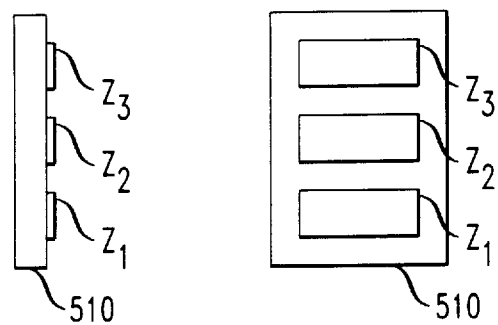
FIG. 4 illustrates a multi-zone partial reflector of the DD optical subsystem of FIG. 3.

FIG. 4 illustrates SP reflector 340 of the DD subsystem used for splitting a primary pulse into secondary pulses. The SP reflector is made from, for example, fused silica 510 or other known suitable material. Such reflectors, for example, are available from Rocky Mountain Instruments of Longmont, CO. Illustratively, the SP reflector is divided into three distinct zones, $Z_1$, $Z_2$, and $Z_3$. The zones are coated with conventional DUV reflective material using well-known coating techniques. The reflectivity of each zone is calculated to appropriately divide the beam into secondary output pulses with the desired intensity. Various techniques which are known in the art can be used to achieve the desired reflectivity in each zone. In accordance to one embodiment, the reflectivity of each zone is chosen to produce secondary pulses of about the same total energy level.

To provide outputs with relatively uniform energy levels, for example, within 10%, the dimensions of each zone should be large enough to capture the shape of the excimer pulse, which typically is about 5×20 mm. In one embodiment, the size of each zone is about 10–20% larger than the beam profile, leaving about a 1–2 mm boundary surrounding the beam. This is often useful in facilitating the coating process.

Figure 5:
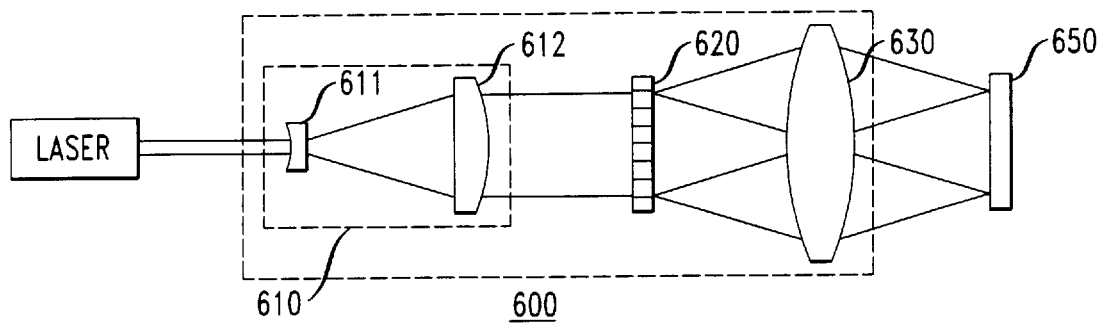
FIG. 5 illustrates a conventional DUV illuminator.

From the DD subsystem, the secondary pulses are input into the illuminator. FIG. 5 illustrates an embodiment of one type of conventional DUV illuminator 600. Such illuminators are described in Ichihara et al., *Illumination System of an Excimer Laser Stepper*, SPIE Vol. 1138, 137 (1989), which is herein incorporated by reference for all purposes. The illuminator comprises expanding optics 610, lens array 620, and a condenser lens 630. A pulse from an excimer laser passes through the expanding optics comprising, for example, cylindrical lenses 611 and 612. The cylindrical lenses transform the rectangular beam shape into a square beam to fill the lens array, such as a fly's-eye lens. Typically, the fly's-eye lens comprises 100 lenses or lenslets, e.g., 10×10 array. The fly's-eye lens samples or breaks up the beam into aerial portions associated with each lenslet. Each sample is diverged by the associated lenslet and then directed at the reticle by the condenser lens. The condenser lens is spatially located so that the lens array is in its front focal plane and a mask 650 is in its back focal plane. Each lenslet in connection with the condenser acts as a telescope to expand the sample. The expanded profile samples are added at the reticle in such a way that the original beam profile averages out to a substantially uniform result.

The function of the illuminator is to provide substantially uniform illumination of the mask, both on a large scale and microscopic level. Non-uniform illumination can create undesirable interference patterns (i.e., "speckle") or large scale inconsistency in the image that is formed on the wafer. See Valiev, et al., The Optimization of Excimer Lasers Radiation Characteristics for Projection Lithography. JJAP Series 3, Proc. of 1989 Intern. Symp. on MicroProcess Conference, pp. 37, which is herein incorporated by reference for all purposes for a discussion on uniformity and coherence of the excitation source. Acceptable uniformity of the illumination depends on the fact that the emerging light from each lenslet is relatively incoherent. The many collimated and expanded beam samples from all the lenslet and condenser combinations overlap in the mask plane. Acceptable uniformity is achieved if the random profile structure errors in each sample tend to cancel when they are added in the intersecting plane. This requires that each sample be incoherent so as to cause rapid random phase changes between the samples to reduce or eliminate potential interference patterns.

A problem with some conventional illuminators is that the expander optics used to fill the fly's-eye lens array may adversely affect uniform illumination of the mask. This is because the spatial coherence of the input pulse is increased as it is being magnified by the expanding optics. Greater coherence in the pulse causes the whole matrix of samples from the lens array to have too many correlated or partly coherent secondary beams. As a result, interference patterns or larger-scale effects of coherent summing are present in the image that is formed on the wafer. However, the use of DD subsystem advantageously fills the fly's eye lens array without requiring expanding optics. The geometry which generates large delays also assures that the portions of the lens array are incoherently illuminated since coherence length is typically a few centimeters.

Figure 6:
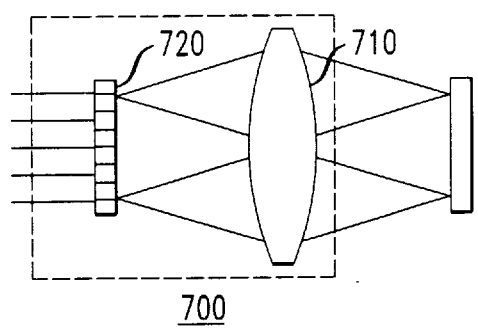
FIG. 6 illustrates a modified illuminator for receiving outputs from the DD subsystem.

Referring to FIG. 6, a modified illuminator 700 comprising a condenser lens 710 and a lens array 720 located at the front focal plane of the condenser lens is shown. The DD subsystem, in the illustrative embodiment, divides the primary input pulse into secondary pulses P1–P5 for input into the illuminator. The secondary outputs have different parallel beam paths with each being separated in time. Consequently, each pulse contacts a different part of the lens array at different instants in time. It should be appreciated by those skilled in the art that the separation of the secondary beam paths should be such that the different parts of the fly's eye lens array are contacted by the secondary pulses. Thus, the secondary pulses effectively scan the lens array to smear away the unwanted coherent patterning.

Furthermore, the DD subsystem ensures that the secondary output pulses are incoherent because the separation between each successive secondary output pulse is significantly greater than about 20 mm, which is typically the extent of the longitudinal coherence of an excimer pulse. For example, a typical excimer pulse with a pulse width of 20 nsec would require a separation of about 20 feet in order to achieve secondary pulse separation of about a pulse width. As such, the DD subsystem provides an additional benefit of decreasing the visibility of interference patterns because the lens array is filled with pulses which have lower coherence than those in conventional illuminators.

Although the beam paths ate illustratively shown as a planar arrangement in 2-dimensional space, it will be understood that there are virtually unlimited degrees of freedom available to configure the beam paths in various arrangements, either in 2 or 3 dimensional space and/or arriving at the illuminator in different orders, to take advantage of various specific illuminator designs, as will be apparent to those skilled in the art. For example, it is useful to randomly mismatch the secondary pulses from the DD subsystem to the grid of the lens array so that adjacent samples do not appear similar. Additionally, the secondary pulse profiles can be spatially grouped more closely together at the lens array by using separate reflector segments to create a small overall convergence in the secondary output pulses from the DD subsystem.

Figure 7:
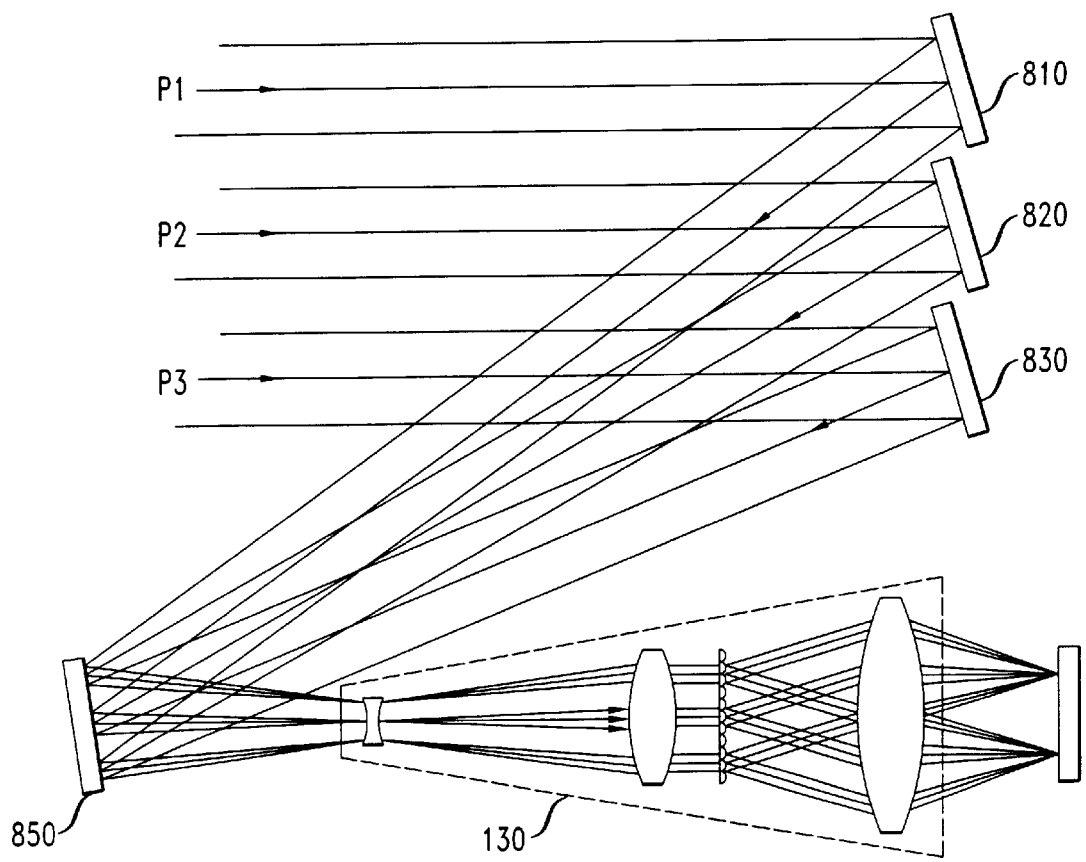
FIG. 7 illustrates a DD output interface for spatially modifying the output of the DD subsystem.

FIG. 7 shows a DD interface used to smooth the secondary output beam paths from the DD subsystem for input into a conventional excimer illuminator 130. The DD interface comprises faceted mirrors 810–830 and reflector 850. The faceted mirrors and the reflector, in combination, converge the output pulses P1, P2, and P3 at a small angle. As a result, the pulses overlap and enter the illuminator in substantially a single path, one at a time. Although the secondary pulses are in a 1-dimensional configuration, it will be understood that different configurations can be used to take advantage of various illuminator designs. This geometry is advantageous if the lens pupil conjugate to the fly's eye array is prone to damage.

Figure 8:
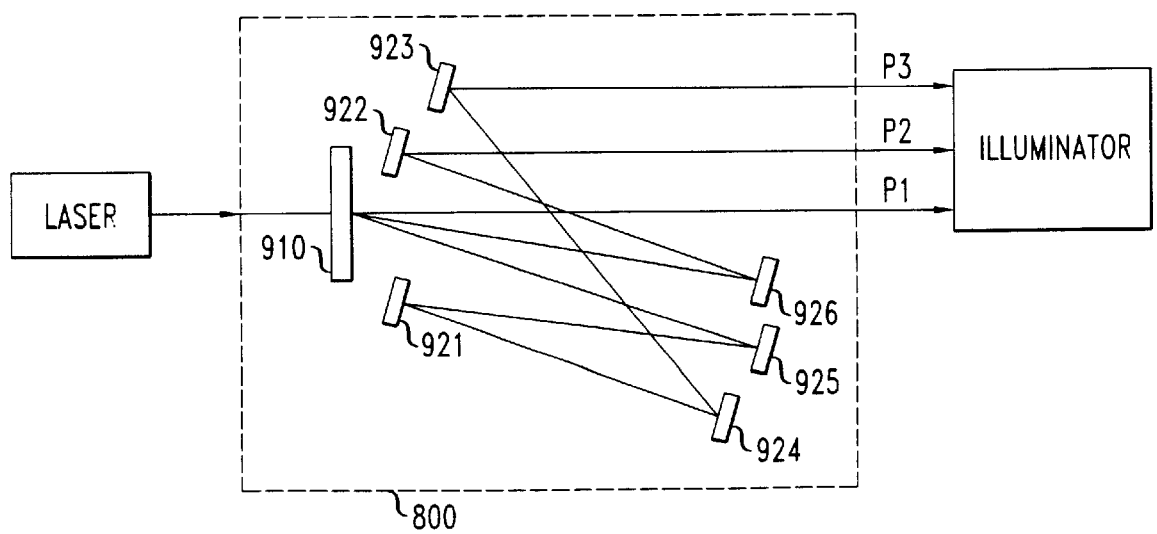
FIG. 8 shows an alternative embodiment of the DD optical subsystem.

FIG. 8 illustrates an embodiment of a DD subsystem 800 for splitting a primary pulse into secondary pulses using a diffractive element. Illustratively, DD subsystem 900 comprises a diffractor 910 and reflectors 920–925. Diffractor 910, such as a phase plate or binary optic made by Teledyne Brown Engineering, separates the primary pulse P into secondary output pulses P1, P2, and P3 with separate beam paths. Using the same concept as the DD subsystem of FIG. 4, reflectors 920–925 are used for folding the multiple beam paths to provide the necessary separation between each output pulse. It will be apparent to those skilled in the art that any geometry for energy separation using various folding schemes are useful to effectively divide and delay the primary pulses into multiple secondary pulses.

The divide and delay subsystem may be provided by optical elements with other functions, so long as delays of appropriate length are created with the intent to reduce the damage rate. More sophisticated illuminators may, to an even greater extent, benefit from the DD subsystem. For example, an ideal illuminator with both reticle field and pupil behavior strongly decoupled from the source will be most easily adapted to take advantage of the damage reduction resulting from the DD subsystem.

In general, the optical elements which make up the DD subsystem will also be prone to damage. It is possible that the invention will be practical with these elements used as consumables and easily replaced, as is typically done with excimer laser optics. The illuminator will be far less sensitive to damage to the projection lens in most cases. Also, the lens or its elements may be expensive or difficult to replace.

The DD elements may act in a sacrificial manner to protect critical elements.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description, but instead should be determined with reference to the appended claims, along with their full scope of equivalents.

The invention claimed is:

1. A method of using an optical lithography system, comprising the steps of:

generating a plurality of primary energy pulses from an energy source of an optical lithography system, wherein each of the primary energy pulses has an intensity, E, a pulse width, $\tau$, and a time gap between each primary energy pulse;

dividing each of the primary energy pulses into N secondary energy pulses, wherein N is at least 2 and wherein each secondary pulse has an intensity about $1/N^{th}$ the intensity of the primary energy pulse;

delaying the N secondary energy pulses associated with each primary energy pulse incrementally in time, wherein the N secondary energy pulses are incrementally delayed within the time gap between each primary energy pulse and wherein the secondary energy pulses are directed onto a projection lens; and transmitting the incrementally delayed N secondary energy pulses from the projection lens onto a layer of energy sensitive material formed on the surface of a substrate.

2. The method of claim 1 wherein the incremental delay for the N secondary energy pulses is at least about the pulse width, $\tau$.

3. The method of claim 1 wherein subsequent to the dividing step, the N secondary energy pulses are separated into N beam paths.

4. The method of claim 3 wherein the N beam paths are parallel.

* * * * *